United States Patent [19]
Chen

[11] Patent Number: 5,723,881
[45] Date of Patent: Mar. 3, 1998

[54] DUAL-BEAM LASER DIODE

[75] Inventor: Kuo-Ti Chen, Taipei, Taiwan

[73] Assignee: Quarton Inc., Taipei, Taiwan

[21] Appl. No.: 759,512

[22] Filed: Dec. 4, 1996

[51] Int. Cl.⁶ .................................................. H01L 33/00
[52] U.S. Cl. ........................... 257/88; 257/89; 257/98; 257/99; 372/50; 372/107; 372/108
[58] Field of Search .................... 257/99, 88, 89, 257/98; 372/50, 107, 108

[56] References Cited

U.S. PATENT DOCUMENTS

| | | | |
|---|---|---|---|
| 5,083,192 | 1/1992 | Rzeznik et al. | 257/99 X |
| 5,105,239 | 4/1992 | Uchino et al. | 257/99 X |
| 5,382,811 | 1/1995 | Takahashi | 257/99 X |
| 5,614,735 | 3/1997 | Kitamura et al. | 257/99 |

FOREIGN PATENT DOCUMENTS

| | | | |
|---|---|---|---|
| 2182802 | 5/1987 | Germany | 257/99 |
| 62-55976 | 3/1987 | Japan | 257/99 |

Primary Examiner—William Mintel
Attorney, Agent, or Firm—Morton J. Rosenberg; David I. Klein; Jun Y. Lee

[57] ABSTRACT

A dual-beam laser diode is provided and includes a base, a first laser diode mounted on the base and having a laser emitting body controlled to emit a laser beam, and a second laser diode mounted between the base and the first laser diode and having a laser emitting body. The second laser diode has a laser emitting body spaced from the laser emitting body of the first laser diode within the range of 3 μm to 5 μm, and controlled to emit a laser beam partially overlapped on the laser beam of the first laser diode. The laser beams of the first laser diode and second laser diode can have different wavelengths and light spot patterns.

3 Claims, 7 Drawing Sheets

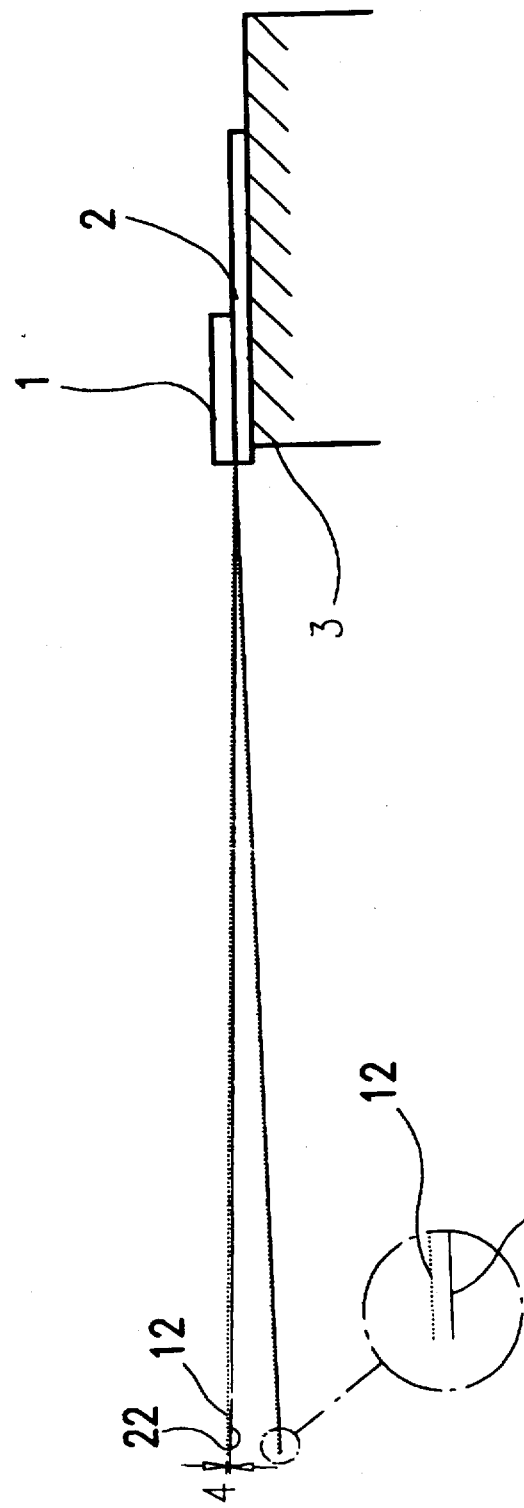

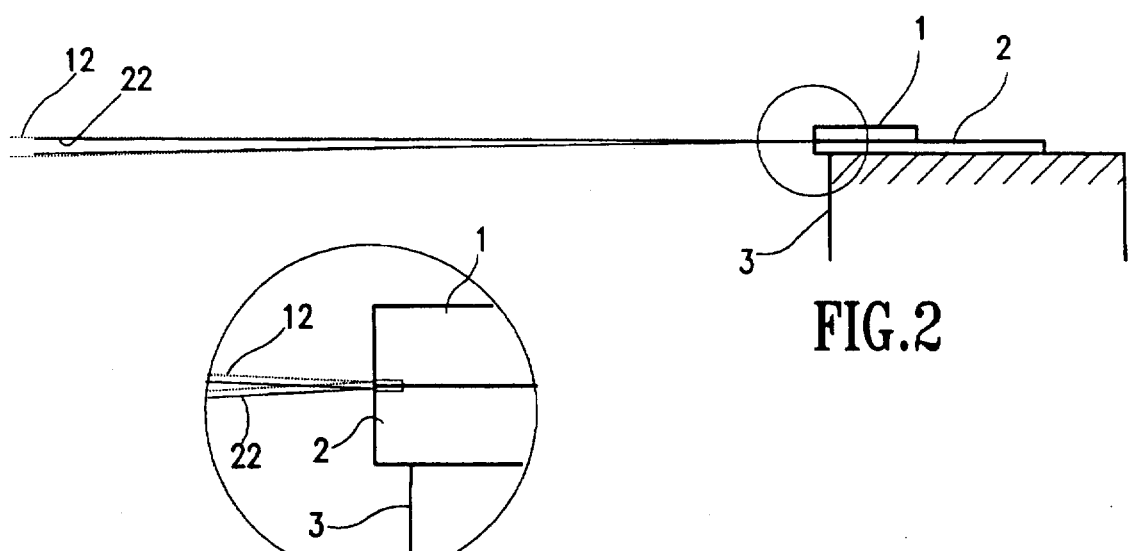

DUAL-BEAM LASER DIODE

BACKGROUND OF THE INVENTION

The present invention relates to laser diodes, and more particularly to a dual-beam laser diode that can be controlled to emit two overlapped laser beams of different wavelength and light spot patterns.

Regular laser diodes produce only one laser beam having a particular wavelength. They cannot simultaneously emit two different wavelengths laser beams. Therefore the application of regular laser diodes is limited.

SUMMARY OF THE INVENTION

The present invention provides a dual-beam laser diode which produces two laser beams having different wavelengh and light spot patterns. According to one aspect of the present invention, the dual beam laser diode comprises a base, a first laser diode mounted on the base and having a laser emitting body controlled to emit a laser beam, and a second laser diode mounted between the base and the first laser diode and having a laser emitting body controlled to emit a laser beam partially overlapped on the laser beam of the first laser diode. According to another aspect of the present invention, the laser beams of the first laser diode and second laser diode can have different wavelengths. According to still another aspect of the present invention, the laser beams of the first laser diode and second laser diode can have different light spot patterns. According to still another aspect of the present invention, the laser emitting body of the first laser diode is spaced from the laser emitting body of the second laser diode at about 3 μm to 5 μm , therefore when one laser diode is damaged, the other diode can still work properly.

BRIEF DESCRIPTION OF THE DRAWINGS

FIG. 1 is a schematic drawing of the present invention, showing two laser beams respectively emitted from the first laser diode and the second laser diode;

FIG. 1A is an enlarged view of a part of FIG. 1, showing the distance of the non-overlapped area between the light spot of the laser beam of the first laser diode and the light spot of the laser beam of the second laser diode;

FIG. 2 is another schematic drawing of the present invention, showing two laser beams respectively emitted from the fist laser diode and second laser diode;

FIG. 3 is an enlarged view of a part of FIG. 2;

DETAILED DESCRIPTION OF THE PREFERRED EMBODIMENT

Figure 7:
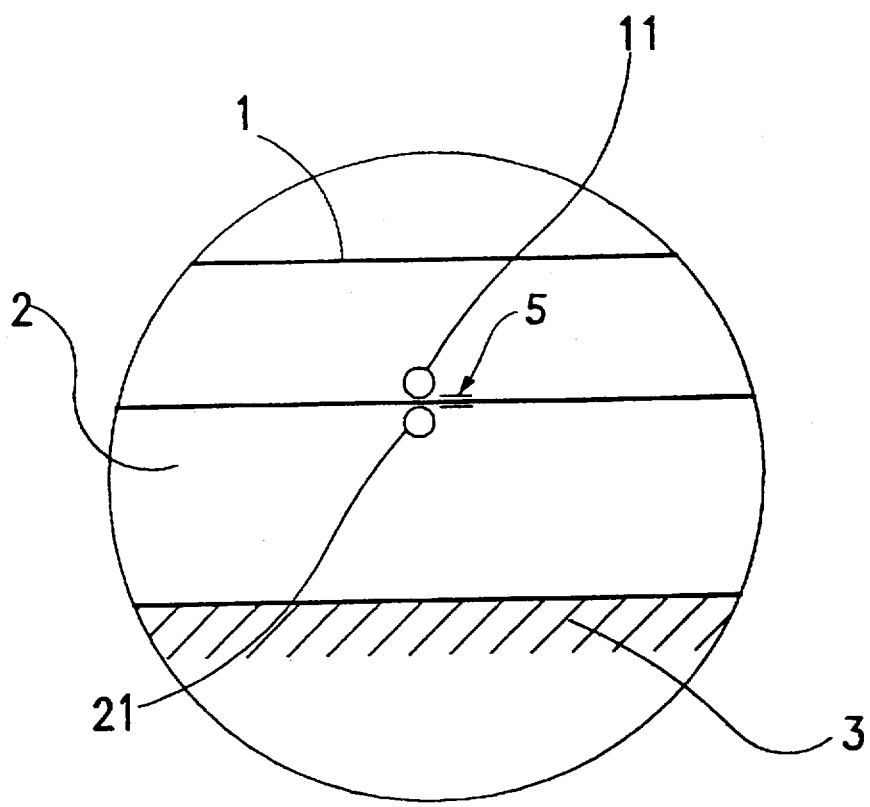
FIG. 7 is an enlarged view of a part of the present invention, showing the distance between the laser emitting body of the first laser diode and the laser emitting body of the second laser diode.
Figure 8:
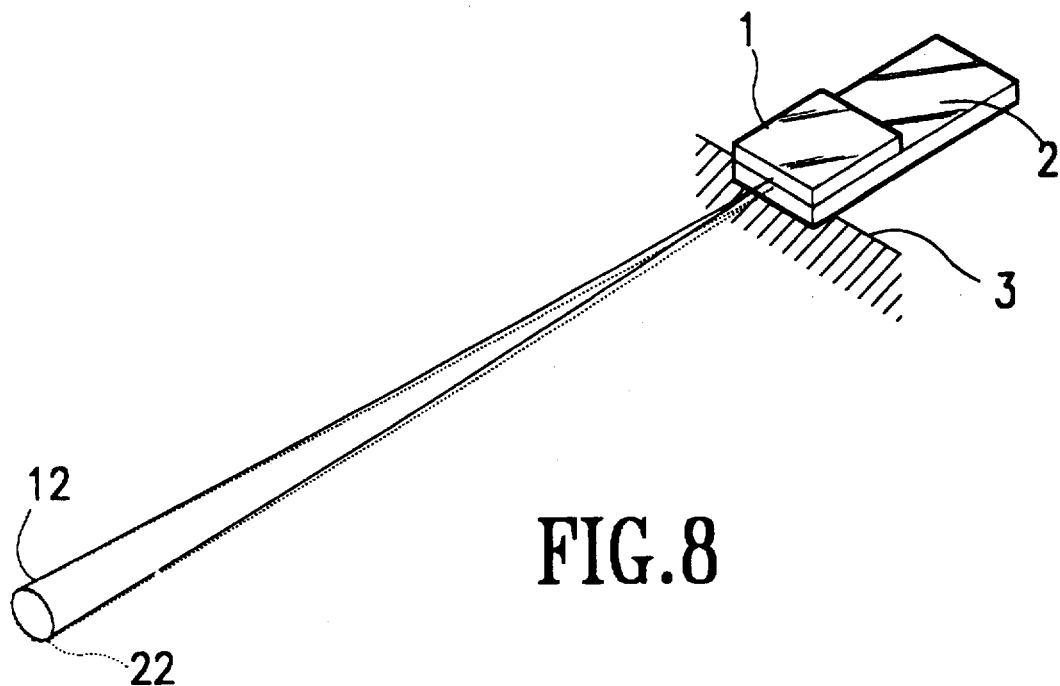
FIG. 8 is an applied view of the present invention, showing a circular light spot pattern produced; and, FIG. 9 is another applied view of the present invention, showing a rectangular light spot pattern produced.
Figure 9:
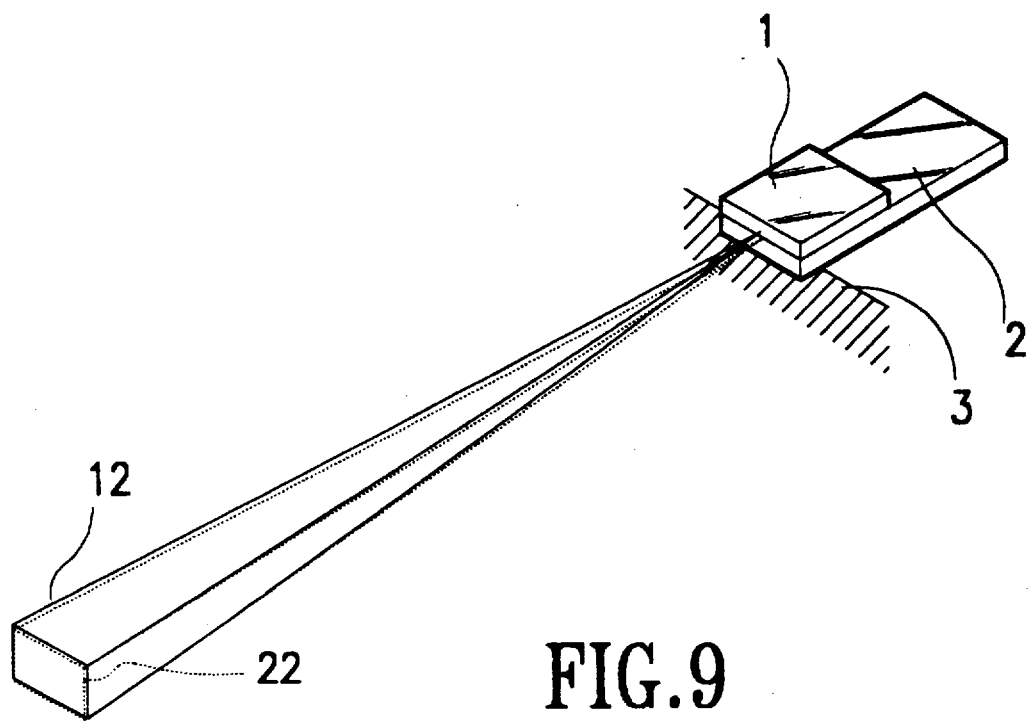

Referring to Figures from 1 to 9, a dual-beam laser diode in accordance with the present invention is generally comprised of a first laser diode 1, a second laser diode 2, and a base 3. The first laser diode 1 is mounted on top of the second laser diode 2, and the second laser diode 2 is supported on the base 3. The base 3 is preferably made from metal or a resin circuit board. The first laser diode 1 and the second laser diode 2 have a respective laser emitting body 11, 21 (see FIG. 7). The distance 5 between the laser emitting body 11 of the first laser diode 1 and the laser emitting body 21 of the second laser diode 2 is as short as about 3 μm to 5 μm. Therefore, the laser beam 12 of the laser emitting body 11 of the first laser diode 1 and the laser beam 22 of the laser emitting body 21 of the second laser diode 2 are substantially overlapped (see FIGS. 1 and 1A) at the initial, and the gap 4 of the non-overlapped area between the light spot of the laser beam 12 of the laser emitting body 11 of the first laser diode 1 and the light spot of the laser beam 22 of the laser emitting body 21 of the second laser diode 2 is minor, therefore the non-overlapped area between the two laser beams 12, 22 is not visually perceived.

Figure 4:
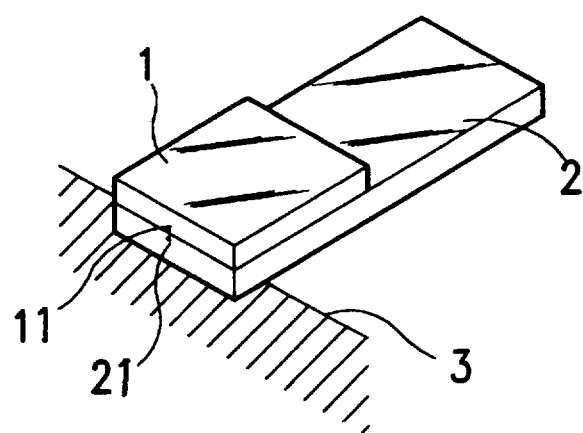
FIG. 4 is a perspective elevational view of the present invention.
Figure 5:
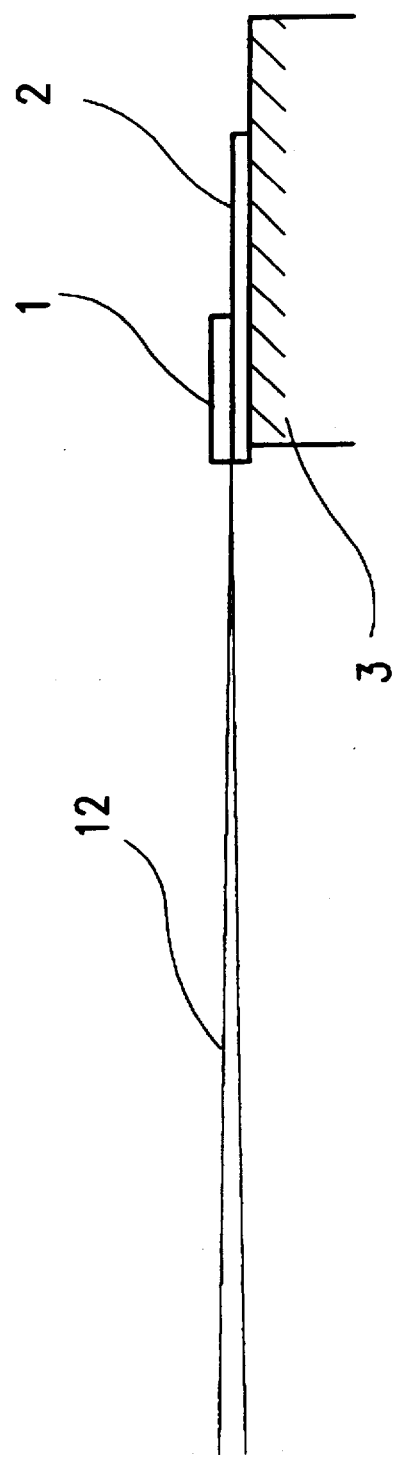
FIG. 5 is a schematic drawing showing a laser beam emitted from the first laser diode according to the present invention.
Figure 6:
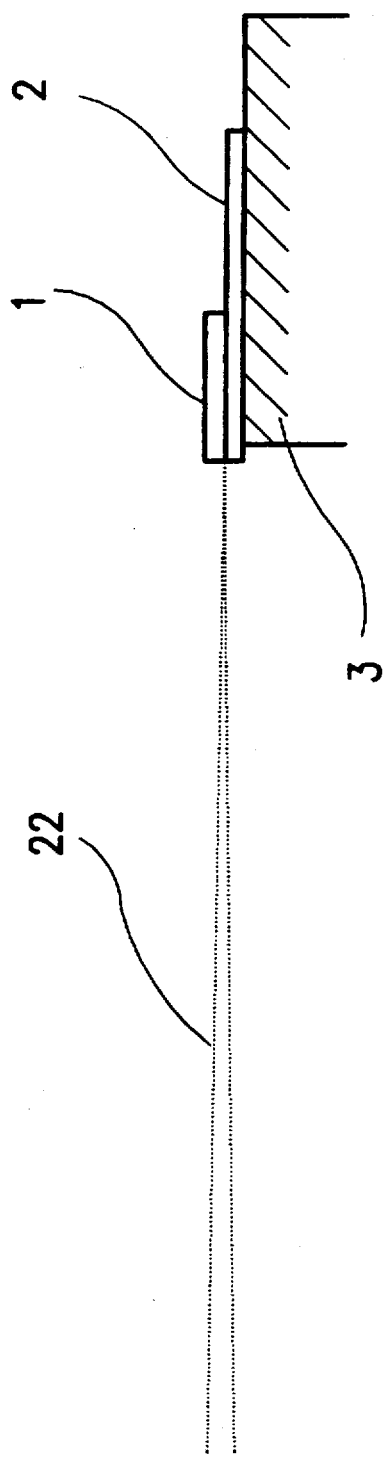
FIG. 6 is a schematic drawing showing a laser beam emitted from the second laser diode according to the present invention.

When in application, the laser emitting body 11 of the first laser diode 1 and the laser emitting body 21 of the second laser diode 2 can be alternatively arranged to produce visible light or invisible light. The laser beam 12 of the laser emitting body 11 of the first laser diode 1 and the laser beam 22 of the laser emitting body 21 of the second laser diode 2 can have different wavelengths. When one laser diode 1 or 2 is damaged, the other laser diode 2 or 1 can still work properly (see FIGS. 5 and 6). The light spot of the laser beam 11 or 21 can have a circular shape, rectangular shape, or any of a variety of geometric shapes.

It is to be understood that the drawings are designed for purposes of illustration only, and are not intended as a definition of the limits and scope of the invention disclosed.

What the invention claimed is:

1. A dual-beam laser diode comprising:
   a base;
   a first laser diode mounted on said base and having a first laser emitting body controlled to emit a first laser beam; and,
   a second laser diode mounted between said base and said first laser diode and having a second laser emitting body controlled to emit a second laser beam, said first laser diode being disposed in overlaying relationship with respect to said second laser diode with said first laser emitting body being closely spaced to said second laser emitting body, said second laser beam substantially overlapping said first laser beam of said first laser diode.

2. The dual-beam laser diode of claim 1 wherein said close spacing between said first laser emitting body of said first laser diode and said second laser emitting body of said second laser diode is within an approximating range of 3 μm to 5 μm and a gap between said overlapped first and second laser beams being visually imperceivable.

3. The dual-beam laser diode of claim 1 wherein said first laser beam and said second laser can be alternately controlled to produce visible light and beam are each of different wavelengths, one of said first and second laser beams being in a visible light spectrum and the other being outside the visible light spectrum.

* * * * *